(12) United States Patent
Krause et al.

(10) Patent No.: US 7,173,840 B2
(45) Date of Patent: Feb. 6, 2007

(54) ACCELERATION OF THE PROGRAMMING OF A MEMORY MODULE WITH THE AID OF A BOUNDARY SCAN (BSCAN) REGISTER

(75) Inventors: Karlheinz Krause, Donaustauf (DE); Elke Tiemeyer, München (DE)

(73) Assignee: Siemens Aktiengesellschaft, Munich (DE)

( * ) Notice: Subject to any disclaimer, the term of this patent is extended or adjusted under 35 U.S.C. 154(b) by 131 days.

(21) Appl. No.: 10/529,331

(22) PCT Filed: Sep. 3, 2003

(86) PCT No.: PCT/DE03/02932

§ 371 (c)(1),
(2), (4) Date: Mar. 24, 2005

(87) PCT Pub. No.: WO2004/029982

PCT Pub. Date: Apr. 8, 2004

(65) Prior Publication Data

US 2006/0041801 A1    Feb. 23, 2006

(30) Foreign Application Priority Data

Sep. 26, 2002    (DE)    ................. 102 44 977

(51) Int. Cl.
*G11C 5/06* (2006.01)

(52) U.S. Cl. .................... 365/63; 326/40; 326/41; 714/727

(58) Field of Classification Search ............. 365/63; 326/40, 41; 714/727
See application file for complete search history.

(56) References Cited

U.S. PATENT DOCUMENTS 5,805,794 A * 9/1998 Jones et al. .............. 714/37
5,841,867 A * 11/1998 Jacobson et al. ......... 713/187
6,356,107 B1 3/2002 Tang et al.
6,937,493 B2 * 8/2005 Krause et al. ............ 365/63
2003/0187629 A1* 10/2003 Gomez ..................... 703/23

FOREIGN PATENT DOCUMENTS

DE    198 33 970 A1    12/1999

* cited by examiner

*Primary Examiner*—Van Thu Nguyen
*Assistant Examiner*—Eric J. Wendler

(57) ABSTRACT

In order to program a memory module, some of its inputs are stimulated via internal memory locations of a so-called boundary scan (BSCAN) register that is provided in the form of an IC or ASIC. In order to activate or deactivate a write operation, the control signal input of the memory module, said control signal input being responsible for generating a WRITE_ENABLE signal, is controlled exclusively. The switching over of the WRITE_ENABLE signal from "LOW" to "HIGH" potential and vice versa thus ensues according to two JTAG instructions of an instruction sequence that provides for the generation of a LOW or HIGH level at the setting signal input or resetting signal input of an update flip-flop of the memory location responsible for generating the WRITE_ENABLE signal. By appropriately modifying the control unit and the BSCAN cell, which stimulates the WRITE_ENABLE signal at the WR input of the memory module, the programming can be accelerated without having to expand the interface between the control unit and the BSCAN register to the board and equipment level. In another embodiment of the invention, a control unit automatically switches over the WRITE_ENABLE signal from "LOW" to "HIGH" potential or from HIGH to LOW potential at an appropriate or rather programmable point in time by setting or resetting the update flip-flop of the memory location responsible for generating the WRITE_ENABLE signal.

15 Claims, 5 Drawing Sheets

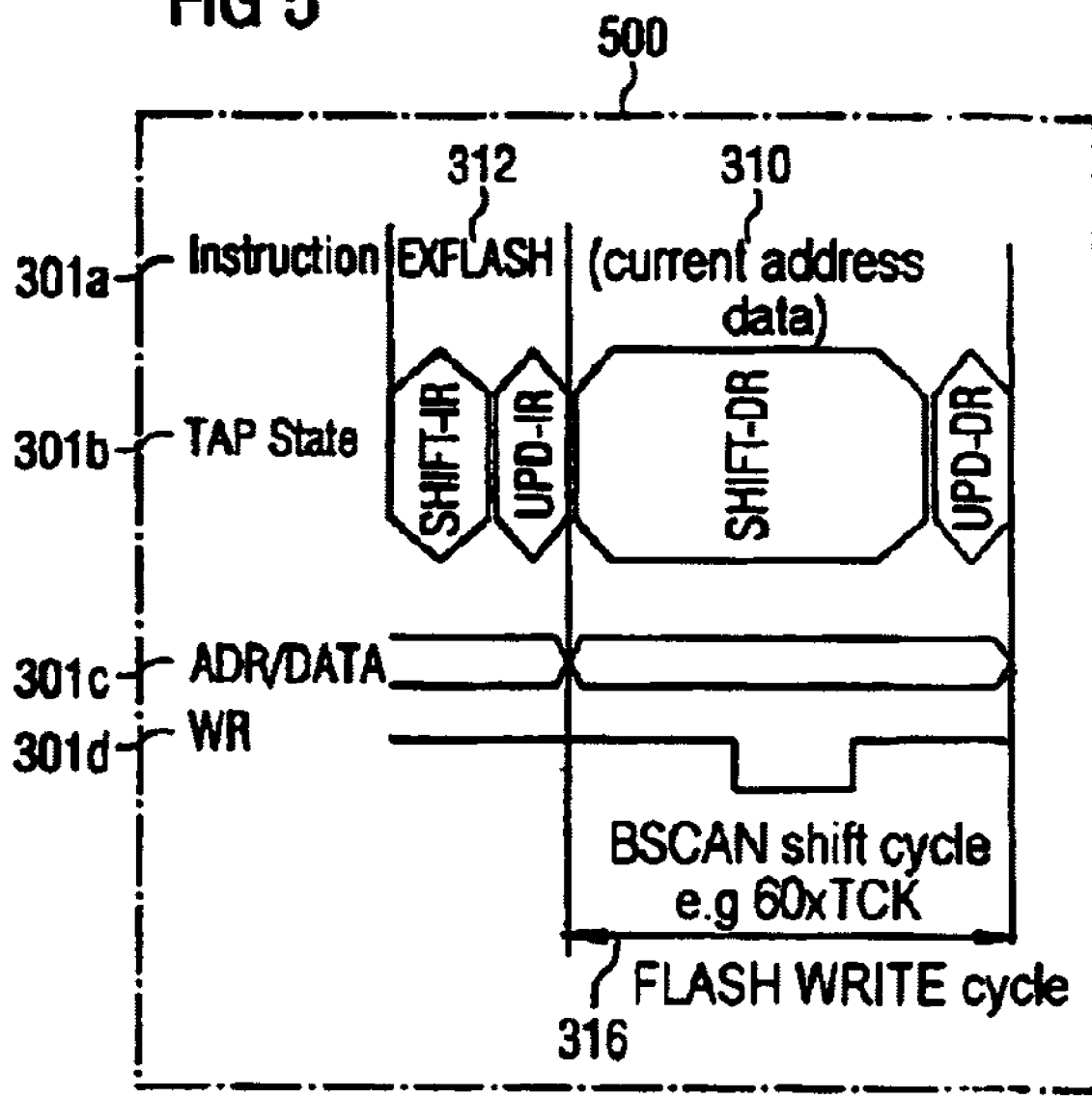

ACCELERATION OF THE PROGRAMMING OF A MEMORY MODULE WITH THE AID OF A BOUNDARY SCAN (BSCAN) REGISTER

CROSS REFERENCE TO RELATED APPLICATIONS

This application is the U.S. National Stage of International Application No. PCT/DE2003/002932, filed Sep. 3, 2003 and claims the benefit thereof. The International Application claims the benefits of German application No. 10244977.5 filed Sep. 26, 2002, both applications are incorporated by reference herein in their entirety.

FIELD OF THE INVENTION

The invention relates to the acceleration of the programming of a memory module with the aid of a Boundary Scan (BSCAN) register.

BACKGROUND OF THE INVENTION

Boundary Scan (BSCAN) is a standardized method of board testing of the Joint Test Access Group (JAG), a consortium founded in 1988 comprising over 200 companies from the semiconductor, testing and system integration fields, and in 1990 the method was formally approved as industry standard IEEE I'D for Test Access Port (TAP) and Boundary Scan (BSCAN) architectures. All connection tests at board level in the production of complex Printed Circuit Boards (PCBs) are based on this specification. If the object under test has its own microprocessor as well as flash-based program memory, a built-In self-test can for example be implemented by loading a flash memory via Boundary Scan with the aid of a self-test program. Test results stored in the memory can again be read out using Boundary Scan once the test has ended.

IEEE 1149.1 is today increasingly replacing In-Circuit Test (ICT) methods since the complexity of the integrated semiconductor circuits (ASICs and FPGAs) to be tested is increasing and as a result the possibility of accessing these components for test purposes, by providing additional test pads on the test object, is becoming ever more difficult. Thus, over the last decades, an exponential increase of the number of connection pins with diameters becoming increasingly smaller has been seen. This trend was accelerated even further by the introduction of the Ball Gate Array (BGA) technology, which brought with it the relocation of the connecting pins to the underside of the module. The solution lay in integrating conventional tests on microchips, such as interruption or short circuit tests, into the chips themselves and planning in a path referred to as the "boundary" for scanning the digital information. Flexible platforms in accordance with the Peripheral Component Interconnect (PCI) or PCI Extensions for Instrumentation (PXI) Standard currently allows the detection of BSCAN controllers and BSCAN software as well as its integration into the relevant PCI or PXI platform. This enables complex solutions to be developed combing conventional function tests and BSCAN-based tests into one universal test platform.

To execute Boundary Scan tests two conditions must be met: At least a few of the integrated circuits (ICs) on the board must comply with the Boundary Scan specification. During testing a BSCAN register is then made to perform the desired test with the aid of test vectors. In addition the product developer must make available a scan path between the individual ICs which leads from a Test Access Port (TAP) through the ICs back again to the TAP where the data is finally scanned. For testing of electrical connections Boundary Scan tests represent an excellent alternative to In-Circuit Tests (ICTs). The costs for performing the function testing are low, and because of the increasing integration and miniaturization of terminals, it can be assumed that there will be a continuing trend towards Boundary Scan.

Whereas the Boundary Scan method according to IEEE 1149.1 has previously primarily been used as an innovative technology for function checking of integrated circuits or for verification and simulation of hardware malfunctions, recent developments have shown that there are further possible applications for this principle. As well as its use for test purposes, Boundary Scan is also very effectively deployed for in-system-programming of flash memories and also Programmable Logic Device (PLD) chips, for example Field Programmable Gate Arrays (FPGAs) with up to 10,000 logic gates per array, or Programmable Logic Arrays (PLAs). In this case the individual control and address inputs of a flash memory are stimulated via the chained BSCAN cells of a BSCAN register assigned to these inputs such that a read or write operation is optionally initiated. As can be seen from the basic functional diagram shown in FIG. 1, the data here can be output or recorded by the corresponding BSCAN cells.

FIG. 3 shows information about the steps required which have to be initiated via the TAP Controller for a write or programming operation. In a first step the address, data and a Module Select (CS) signal are output. Then the WRITE signal is activated in a second step, with nothing changing in the other signals. Finally, in a third step the WRITE signal is deactivated without changing the other signals.

The problem is that programming is made very time-consuming by this method since three cycles of the entire BSCAN register are required for one write operation.

Conventional methods in accordance with the prior art resolve this problem either by shortening the BSCAN chain or by direct control of the WRITE input:

a) Since the programming time depends on the length of the BSCAN chain, the programming can be accelerated in the first case by reducing the chain by the BSCAN cell necessary for flash programming and activating with a separate instruction (SHORTEX) instead of the usual instruction (EXTEST).

b) In the last case the flash memory can be stimulated directly with the aid of an additional signal which is output via the TAP Controller defined in the IEEE 1149.1 Standard. This requires the test or programming equipment to support the control of an additional signal and an additional pin to be provided on the module for this interface embodied as a plug-in connection.

SUMMARY OF THE INVENTION

Using the above-mentioned prior art as its starting point, the object of the present invention is to provide a method for programming a memory module by individual stimulation of its control signal and/or address inputs via memory cells of a BSCAN register for the purposes of generating a WRITE_ENABLE signal to activate or deactivate a write operation, with the aid of which the time needed for programming of the memory module can be decisively reduced.

In accordance with the invention this object is achieved by the features of the independent patent claims. Advantageous exemplary embodiments which further develop the idea behind the invention are defined in the dependent patent claims.

within the framework of the inventive solution—in accordance with the object of the invention defined in the previous section—a method and also a control unit for programming a memory module by stimulating individually its control signals, data and/or address inputs via internal memory cells of a Boundary Scan (BSCAN) register is provided, which is realized as an application-specific integrated circuit (ASIC). To activate or deactivate a write operation in this case exclusively the control input of the memory module responsible for the generation of a WRITE ENABLE signal is controlled.

Through a modification of the TAP controller as well as the BSCAN cell which stimulates the WRITE_ENABLE signal at the input of the flash memory, the flash-programming can be significantly accelerated, without the TAP interface having to be expanded at board and equipment level.

BRIEF DESCRIPTION OF THE DRAWINGS

Further characteristics, features, advantages and applications of the underlying invention are produced by the subordinate dependent patent claims as well as by the following description of two exemplary embodiments of the invention, which are depicted in FIGS. 2, 4 and 5. The Figures show FIG. 1 the basic diagram of a circuit arrangement for executing a Boundary Scan (BSCAN) method for the purposes of programming a programmable flash EPROM according to the prior art, FIG. 2 an expanded basic diagram of the circuit arrangement for executing a BSCAN method for the purposes of programming a programmable flash EPROM in accordance with the prior art with the aid of a Test Access Port (TAP) Controller, FIG. 3 the instruction sequence of a FLASH WRITE operation for programming a programmable flash EPROM with the aid of a BSCAN register with no time saving in accordance with the prior art, FIG. 4 a first variant of the instruction sequence of a FLASH WRITE operation for programming a programmable flash EPROM with the aid of a BSCAN register with time saving by means of access via two special instructions in accordance with the underlying invention and FIG. 5 a second variant of the instruction sequence of a FLASH WRITE operation for programming a programmable flash-EPROM with the aid of a BSCAN register with time saving through access via fixed (if nec. programmable) timing of the TAP controller in accordance with the underlying invention.

DETAILED DESCRIPTION OF THE INVENTION

Figure 1:
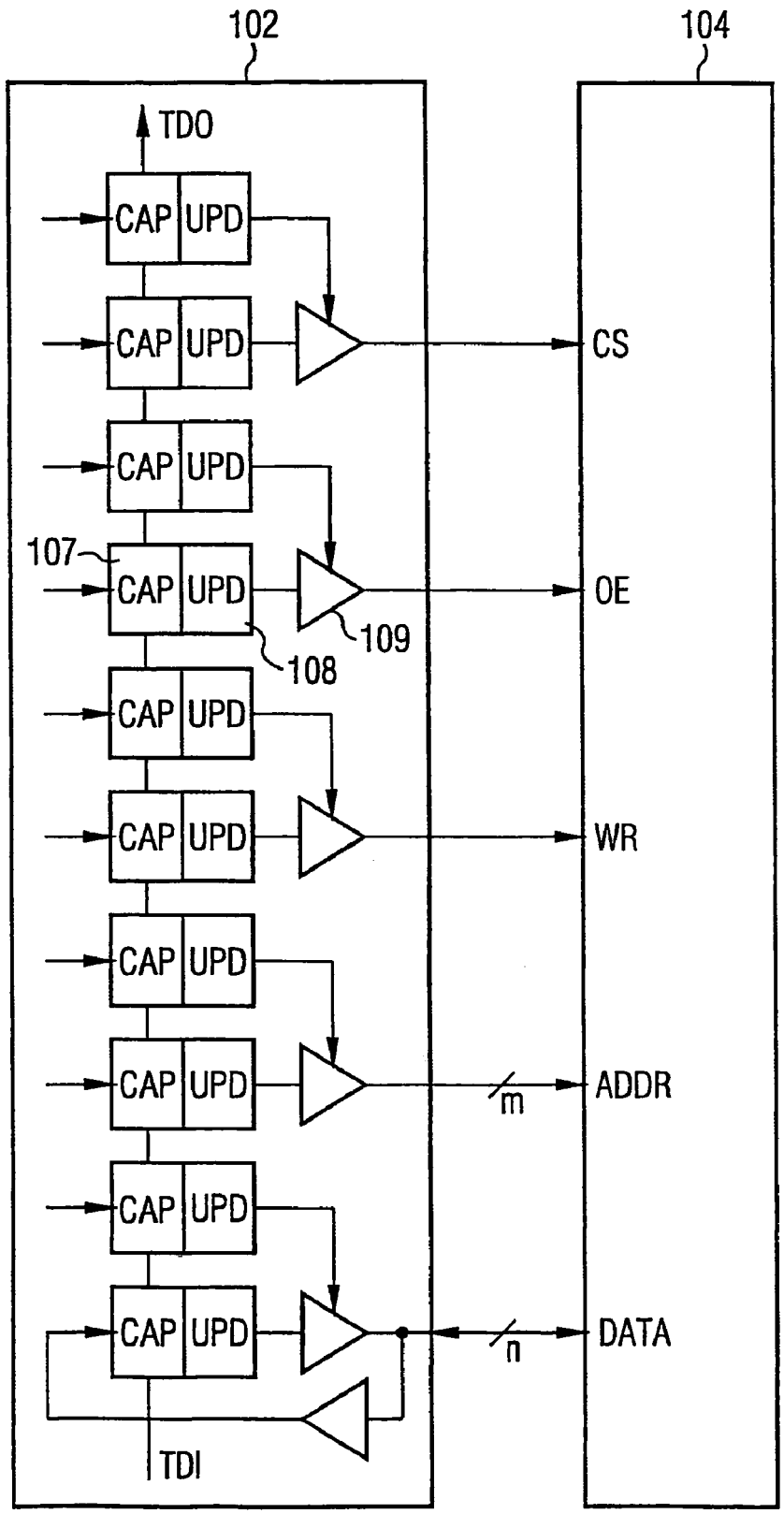
Figure 2:
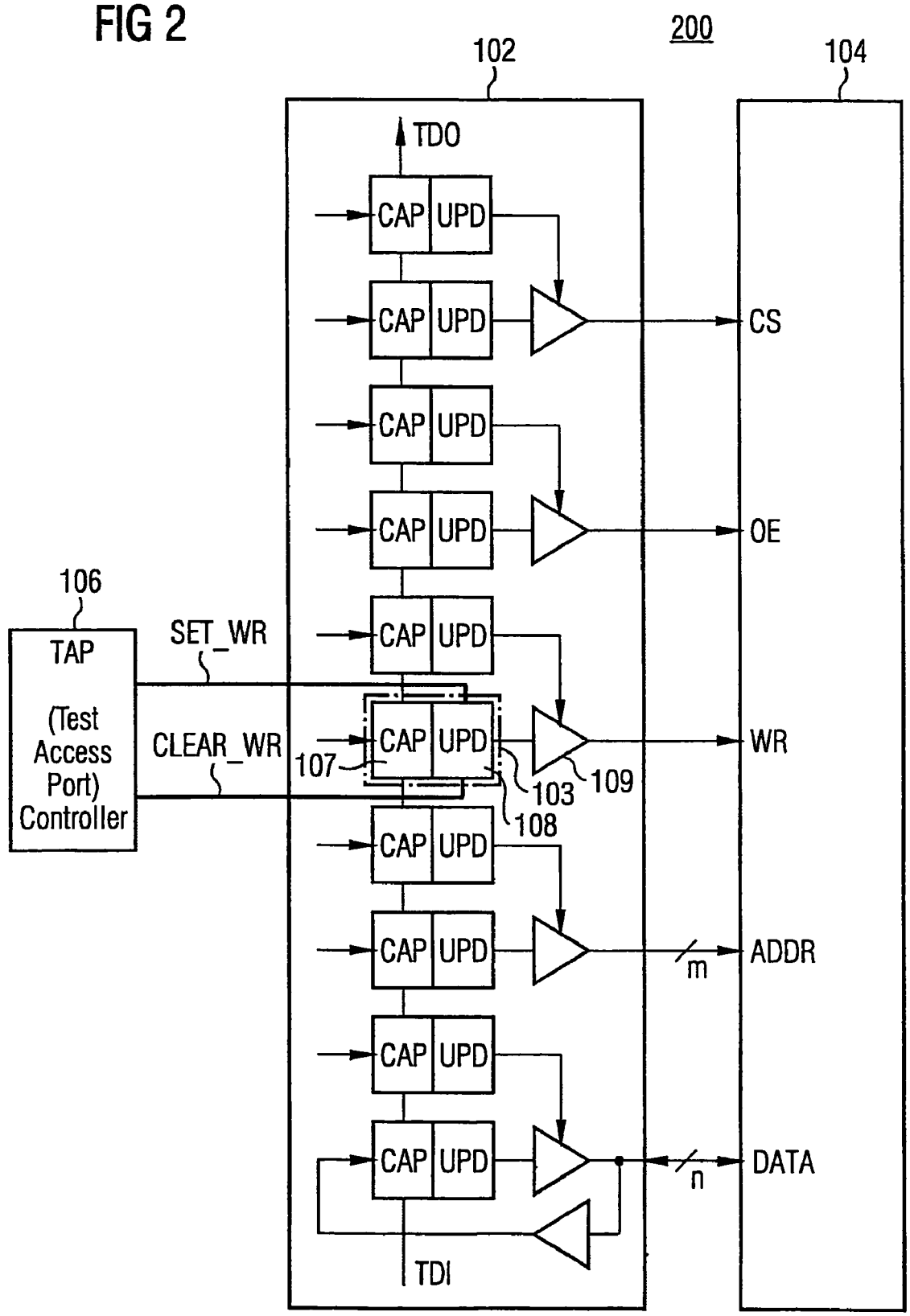

The idea behind the inventive solution will be explained in greater detail below with reference to the exemplary embodiments shown in FIGS. 2, 4 and 5. The meaning of the symbols provided with reference numbers in FIGS. 1 to 4 can be found in the enclosed list of reference numbers.

Within the framework of the present invention there is provision for a modification of the TAP Controller 106 and the BSCAN cell 103, which stimulates the WRITE_ENABLE signal 301d of the flash memory 104, which enables the flash programming to be significantly accelerated without the interface between TAP Controller 106 and BSCAN register 102 being needed to be expanded at board and equipment level. Instead the modification takes place in the BSCAN register 102. There are two options for doing this, which will be described in greater detail below.

(a) Generation of the WRITE Pulse Using Two Instructions

So that the complete BSCAN register 102 does not have to be loaded again for each write operation, to bring the BSCAN cell 103 which stimulates the WRITE_ENABLE signal 301d of the flash memory 104 to the desired potential, the BSCAN-cell 103 concerned is controlled using two specific JTAG instructions 306 and 308. The instruction "WR_L" ensures a "LOW" potential, the instruction "WR_H" a "HIGH" potential at the relevant BSCAN cell 103. An expanded basic diagram of the circuit arrangement for executing a BSCAN method in accordance with this exemplary embodiment of the present invention is shown in FIG. 2.

In the TAP Controller 106 a SET_WR or CLEAR_WR respectively is generated from these two instructions 306 or 308 which either sets or resets the update flip-flop 108 of the BSCAN cell 103 responsible for the generation of the WRITE_ENABLE signal 301d. Both instructions are typically encoded with 4 or 8 bits, so that compared to the conventional solution in accordance with the prior art, in which to initiate a write operation the complete BSCAN register 102 must be reloaded in each case, a clear speed benefit is produced. The BSCAN register 102 still comprises around 60 bits, even with its shorter length.

Figure 4:
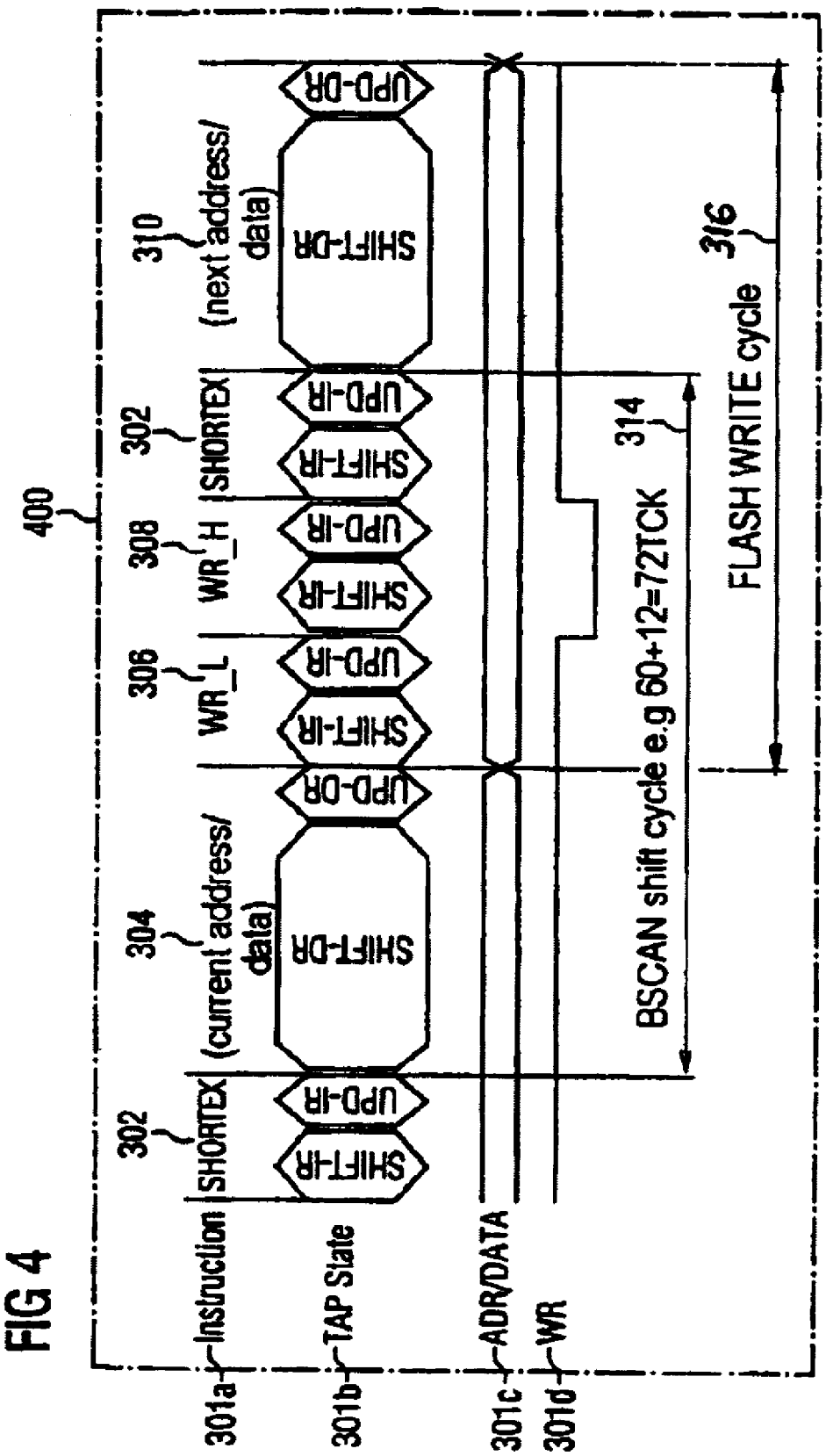

FIG. 4 shows a first variant for the instruction sequence 400 of a FLASH WRITE operation for programming a programmable flash EPROM via a BSCAN register with time saving through access via two specific instructions. After the address, data and the Module Select (CS) have been output (appr. 60 bits) only three further instructions—"WR_L", "WR_H" and "SHORTEX"—each with 4 bits are necessary. If the clock pulses responsible for the state transitions of the WRITE_ENABLE signal 301d are not taken into account, a relationship of $$\frac{T_{P,ges}^{Erf.,AB1}}{T_{P,ges}^{Sdt}} = \frac{L_{I,ges}^{Erf.,AB1}}{L_{I,ges}^{Sdt}} = \frac{1.60\,\text{Bit} + 3.4\,\text{Bit}}{3.60\,\text{Bit}} \approx 40\%$$

is produced, where $L_{I,ges}^{Sdt}$ [bits] gives the total length of the instruction sequence for use of conventional BSCAN methods according to the prior art, $L_{I,ges}^{Erf.,AB1}$ [bits] gives the total length of the instruction sequence for using the first exemplary embodiment of the invention described in section (a), $T_{P,ges}^{Sdt}$ [ns] gives the total duration of a FLASH WRITE cycle when using conventional BSCAN methods according to the prior art and $T_{P,ges}^{Erf.,AB1}$ [ns] gives the total duration of a FLASH WRITE when using the first exemplary embodiment of the invention described in section (a).

Figure 3:
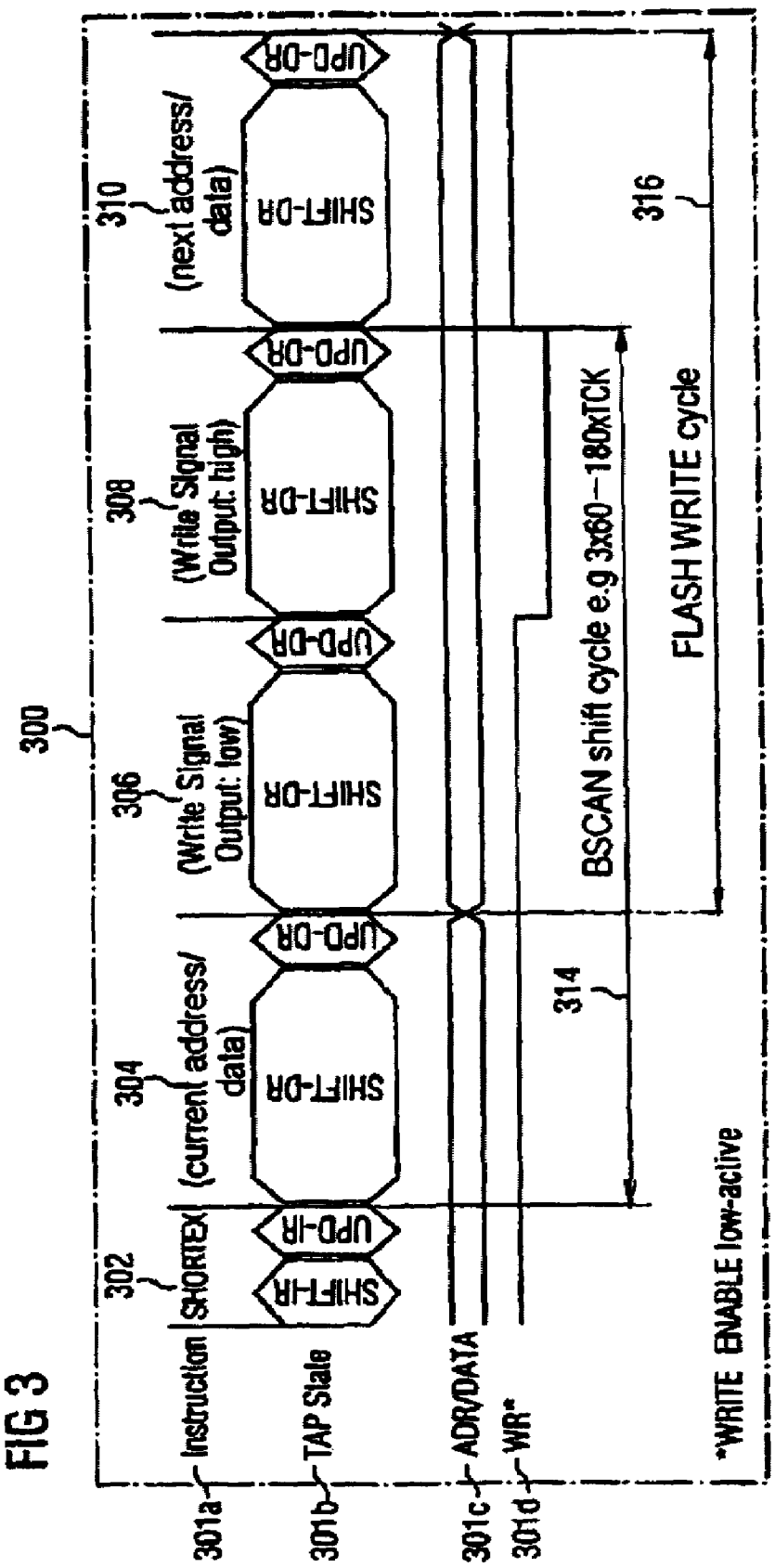

This means that with this first exemplary embodiment of the method in accordance with the invention compared to the programming method shown in FIG. 3, a reduction in the programming time of 60% can be achieved.

A further benefit which is produced by this solution lies in the fact that the "HIGH" or "LOW" level values of the WRITEENABLE signals 301d can be generated in any given timing sequence, with this sequence being able to be controlled by the instructions 306 and 308.

(b) Automatic Generation of the WRITE Pulse

So that the complete BSCAN register 102 does not always have to be reloaded in order to bring the BSCAN cell 103, which stimulates the WRITE_ENABLE signal 301*d* of the flash memory 104 to the desired potential, the BSCAN cell 103 involved will be controlled automatically during the application of the address, data and the Module Select (CS) signal at the BSCAN register 102 by the TAP Controller 106 so that a WRITE pulse is generated at a suitable point in time.

FIG. 5 shows a second variant for the instruction sequence 500 of a FLASH WRITE operation for programming a programmable Flash EPROM 104 via BSCAN register 102 with time saving through access via fixed timing of the TAP Controller 106.

This timing of the TAP Controller can if necessary be programmed via further registers which can loaded via further instructions.

TAP Controller 106 automatically generates a SET_WR or CLEAR_WR pulse in each case which either sets or resets the update flip-flop 108 of BSCAN cell 103. Since the automatic may not occur for each BSCAN EXTEST or SHORTEX instruction, either a separate command (EX-FLASH) is to be introduced or the TAP Controller 106 is notified before the EXTEST instruction by an additional instruction ("WR_ON") that a WRITE impulse is to be generated automatically. This function can be reset in accordance with the invention with the aid of a further instruction ("WR_OFF").

The duration of the WRITE pulse can also be set by means of an additional data register programmed via the TAP interface. FIG. 5 shows the timing sequence. The diagram clearly shows that only one JTAG instruction (EXFLASH) is necessary. If the clock pulses responsible for the state transitions of the WRITE_ENABLE signal 301*d* are not taken into account, a relationship of $$\frac{T_{P,ges}^{Erf.,AB2}}{T_{P,ges}^{Sdt}} = \frac{L_{I,ges}^{Erf.,AB2}}{L_{I,ges}^{Sdt}} = \frac{1.60\,\text{Bit}}{3.60\,\text{Bit}} \approx 33.3\,\%$$

is produced, where $T_{P,ges}^{Sdt}$ [bits] gives the total length of the instruction sequence for use of conventional BSCAN methods according to the prior art, $L_{I,ges}^{Erf.,AB2}$ [bits] gives the total length of the instruction sequence for use of the second exemplary embodiment of the invention described in ring section (b), $T_{P,ges}^{Sdt}$ [ns] gives the overall duration of a FLASH WRITE cycle with use of the conventional BSCAN according to the prior art and $T_{P,ges}^{Erf.,AB2}$ [ns] gives the total duration of a FLASH WRITE when using the second exemplary embodiment of the invention described in section (b).

This means that with this second exemplary embodiment of the method in accordance with the invention, compared to the programming method in accordance with the prior art shown in FIG. 3 a reduction in the programming time by about 66.7% can be achieved, since only the loading (SHIFT-DR) of a combined address and data block. of 60 bits in size is necessary.

The underlying invention is based on a method and a control unit for programming a memory module by stimulating its individual control signals, data and/or address inputs via internal memory cells of what is known as a Boundary Scan (BSCAN) register which is realized as an integrated circuit (IC or ASIC). To activate or deactivate a write operation in this case exclusively the control input responsible for the generation of a WRITE_ENABLE signal of the memory module is controlled.

The invention further comprises a control unit for programming a memory module by stimulating individual inputs of the memory module via at least one memory cell of a BSCAN register for generating a WRITE_ENABLE signal for the purposes of activating or deactivating a write operation, the control unit adapted for automatically switching the WRITE_ENABLE signal from "LOW" to "HIGH" potential or from "HIGH" to "LOW" potential by a control unit, wherein an update flip-flop of the memory cell responsible for the generation of the WRITE_ENABLE signal is set or reset.

The invention further comprises a memory cell of a BSCAN register (102), which is used when programming a memory module (104) for stimulation of individual inputs (CS, OE, WR, ADDR, DATA) of the memory module (104) for the purposes of initiating or ending a write operation, the memory cell adapted for exclusively activating a control signal input of the memory module responsible for activating or deactivating a write operation, wherein a switch-over of a WRITE ENABLE signal fed to the control signal input by the memory cell from "LOW" to "HIGH" potential or from "HIGH" to "LOW" potential is controlled using an instruction sequence fed to inputs of an update flip-flop of the memory cell, the update flip-flop generating the WRITE ENABLE signal having a "LOW" level or a "HIGH" level based on the instruction sequence.

The invention further comprises a memory cell of a BSCAN register (102), which is used when programming a memory module (104) for stimulation of individual inputs (CS, OE, WR, ADDR, DATA) of the memory module (104) for the purposes of initiating or ending a write operation, the memory cell adapted for automatically switching a WRITE_ENABLE signal from "LOW" to "HIGH" potential or from "HIGH" to "LOW" potential by a control unit, wherein an update flip-flop of the memory cell responsible for the generation of the WRITE_ENABLE signal is set or reset.

The invention further comprises a BSCAN register, consisting of a number of memory cells (103) for control of a programmable memory module (104), which is used for stimulation of individual inputs (CS, OE, WR, ADDR, DATA) of the memory module (104) for the purposes of initiating or ending a write operation, the BSCAN register adapted for performing a method for programming a memory module by stimulating individual inputs of the memory module via at least one memory cell of the BSCAN register by exclusively activating a control signal input of the memory module responsible for activating or deactivating a write operation, wherein a switch-over of a WRITE ENABLE signal fed to the control signal input by the memory cell from "LOW" to "HIGH" potential or from "HIGH" to "LOW" potential is controlled using an instruction sequence fed to inputs of an update flip-flop of the memory cell, the update flip-flop generating the WRITE ENABLE signal having a "LOW" level or a "HIGH" level based on the instruction sequence.

The invention further comprises a BSCAN register, consisting of a number of memory cells (103) for control of a programmable memory module (104), which is used for stimulation of individual inputs (CS, OE, WR, ADDR, DATA) of the memory module (104) for the purposes of initiating or ending a write operation, the BSCAN register adapted for performing a method for programming a memory module by stimulating individual inputs of the memory module via at least one memory cell of the BSCAN register for generating a WRITE_ENABLE signal for the purposes of activating or deactivating a write operation, by automatically switching the WRITE_ENABLE signal from "LOW" to "HIGH" potential or from "HIGH" to "LOW" potential by a control unit, wherein an update flip-flop of the memory cell responsible for the generation of the WRITE_ENABLE signal is set or reset.

The invention claimed is:

1. A method for programming a memory module by stimulating individual inputs of the memory module via at least one memory cell of a Boundary Scan Register (BSCAN), the method comprising:

exclusively activating such control signal input of the memory module responsible for activating or deactivating a write operation, wherein a switch-over of a WRITE ENABLE signal fed to the control signal input by the memory cell from "LOW" to "HIGH" potential or from "HIGH" to "LOW" potential is controlled using an instruction sequence fed to inputs of an update flip-flop of the memory cell, the update flip-flop generating the WRITE ENABLE signal having a "LOW" level or a "HIGH" level based on the instruction sequence.

2. The method according to claim 1, wherein the "LOW" or "HIGH" levels at the inputs of the update flip-flop can be generated in any given timing sequence.

3. The method according to claim 1, wherein the timing sequence of the "LOW" or "HIGH" levels at the setting signal input or resetting signal input of the update flip-flop is controlled by the instruction sequence.

4. The method according to claim 2, wherein the timing sequence of the "LOW" or "HIGH" levels at the setting signal input or resetting signal input of the update flip-flop is controlled by the instruction sequence.

5. The method according to claim 1, wherein the signals for the update-flip-flop are generated by a control unit based on the instruction sequence.

6. The method according to claim 2, wherein the signals for the update-flip-flop are generated by a control unit as a function of the instruction sequence.

7. The method according to claim 3, wherein the signals for the update-flip-flop are generated by a control unit as a function of the instruction sequence.

8. A method for programming a memory module by stimulating individual inputs of the memory module via at least one memory cell of a BSCAN register for generating a WRITE_ENABLE signal for the purposes of activating or deactivating a write operation, the method comprising:

automatically switching the WRITE_ENABLE signal from "LOW" to "HIGH" potential or from "HIGH" to "LOW" potential by a control unit, wherein an update flip-flop of the memory cell responsible for the generation of the WRITE_ENABLE signal is set or reset.

9. The method according to claim 8, wherein the automatic generation of a setting signal for activating the write operation can be activated by the control unit using a programming command.

10. The method according to claim 9, wherein the automatic generation of the setting signal can be prevented if specific instructions are present.

11. The method according to claim 8, wherein a further instruction is used, with which the control unit can be notified that a setting signal for activating the write operation is to be automatically generated.

12. The method according to claim 8, wherein a further instruction is used, with which the control unit can be notified that a reset signal for deactivating the write operation is to be automatically generated.

13. The method according to claim 11, wherein a further instruction is used, with which the control unit can be notified that a reset signal for deactivating the write operation is to be automatically generated.

14. The method according to claim 8, wherein the suitable point in time for automatic switchover of the WRITE_ENABLE signal is programmed by suitable instructions.

15. A control unit for programming a memory module by stimulating individual inputs of the memory module via at least one memory cell of a Boundary Scan Register (BSCAN), the control unit adapted for exclusively activating a control signal input of the memory module responsible for activating or deactivating a write operation, wherein a switch-over of a WRITE ENABLE signal fed to the control signal input by the memory cell from "LOW" to "HiGH" potential or from "HIGH" to "LOW" potential is controlled using an instruction sequence fed to inputs of an update flip-flop of the memory cell, the update flip-flop generating the WRITE ENABLE signal having a "LOW" level or a "HIGH" level based on the instruction sequence.

* * * * *